United States Patent
Thomas et al.

(10) Patent No.: US 8,761,321 B2
(45) Date of Patent: Jun. 24, 2014

(54) OPTIMAL FEEDBACK WEIGHTING FOR SOFT-DECISION CANCELLERS

(75) Inventors: John K. Thomas, Erie, CO (US); Michael L McCloud, Boulder, CO (US); Vijay Nagarajan, Boulder, CO (US)

(73) Assignee: III Holdings 1, LLC, Wilmington, DE (US)

( * ) Notice: Subject to any disclaimer, the term of this patent is extended or adjusted under 35 U.S.C. 154(b) by 2647 days.

(21) Appl. No.: 11/233,636

(22) Filed: Sep. 23, 2005

(65) Prior Publication Data

US 2006/0227909 A1    Oct. 12, 2006

Related U.S. Application Data (63) Continuation-in-part of application No. 11/100,935, filed on Apr. 7, 2005.

(51) Int. Cl.
     *H03D 1/04*    (2006.01)
(52) U.S. Cl.
     USPC ........... 375/346; 375/267; 375/347; 370/310; 370/347
(58) Field of Classification Search
     USPC ........................................................ 375/346
     See application file for complete search history.

(56) References Cited

U.S. PATENT DOCUMENTS

| | | | |
|---|---|---|---|
| 3,742,201 A | 6/1973 | Groginsky | 235/156 |
| 4,088,955 A | 5/1978 | Baghdady | 325/56 |
| 4,309,769 A | 1/1982 | Taylor, Jr. | 375/1 |
| 4,359,738 A | 11/1982 | Lewis | 343/100 |
| 4,601,046 A | 7/1986 | Halpern et al. | 375/38 |
| 4,665,401 A | 5/1987 | Garrard et al. | 342/75 |
| 4,670,885 A | 6/1987 | Parl et al. | 375/1 |
| 4,713,794 A | 12/1987 | Byington et al. | 365/45 |
| 4,780,885 A | 10/1988 | Paul et al. | 375/40 |
| 4,856,025 A | 8/1989 | Takai | 375/40 |
| 4,893,316 A | 1/1990 | Janc et al. | 375/44 |
| 4,922,506 A | 5/1990 | McCallister et al. | 375/1 |

(Continued)

FOREIGN PATENT DOCUMENTS

| | | | |
|---|---|---|---|
| DE | 4201439 | 7/1993 | H04L 27/00 |
| DE | 4326843 | 2/1995 | H04B 7/08 |

(Continued)

OTHER PUBLICATIONS

H.Yan et. al, "Parallel Interference Cancellation for Uplink Multirate Overlay CDMA Channels," IEEE Trans. Comm, V 53, No. 1, Jan. 2005, pp. 152-161.

(Continued)

*Primary Examiner* — Lihong Yu
(74) *Attorney, Agent, or Firm* — McAndrews, Held & Malloy, Ltd.

(57) ABSTRACT

A receiver produces optimal weights for cancelling multipath interference. An SINR measurement module generates SINR measurements corresponding to soft symbol estimates produced by a baseband receiver from a received multipath signal. Each soft symbol estimate is replaced with either a hard estimate or a weighted soft estimate based on how each corresponding SINR measurement compares to a predetermined threshold. The received multipath signal and estimated interference signals generated from the hard symbol estimates and/or the weighted soft symbol estimates are combined to produce interference cancelled signals that may be combined via maximum ratio combining to produce an interference-cancelled MRC signal.

85 Claims, 6 Drawing Sheets

(56) References Cited

U.S. PATENT DOCUMENTS

| | | | | |
|---|---|---|---|---|
| 4,933,639 A | 6/1990 | Barker | | 324/309 |
| 4,965,732 A | 10/1990 | Roy, III et al. | | 364/460 |
| 5,017,929 A | 5/1991 | Tsuda | | 342/427 |
| 5,099,493 A | 3/1992 | Zeger et al. | | 375/1 |
| 5,105,435 A | 4/1992 | Stilwell | | 375/1 |
| 5,109,390 A | 4/1992 | Gilhousen et al. | | 375/1 |
| 5,119,401 A | 6/1992 | Tsujimoto | | 375/14 |
| 5,136,296 A | 8/1992 | Roettger et al. | | 342/26 |
| 5,151,919 A | 9/1992 | Dent | | 375/1 |
| 5,218,359 A | 6/1993 | Minamisono | | 342/383 |
| 5,218,619 A | 6/1993 | Dent | | 375/1 |
| 5,220,687 A | 6/1993 | Ichikawa et al. | | 455/254 |
| 5,224,122 A | 6/1993 | Bruckert | | 375/1 |
| 5,237,586 A | 8/1993 | Bottomley | | 375/1 |
| 5,263,191 A | 11/1993 | Kickerson | | 455/304 |
| 5,280,472 A | 1/1994 | Gilhousen et al. | | 370/18 |
| 5,305,349 A | 4/1994 | Dent | | 375/1 |
| 5,325,394 A | 6/1994 | Bruckert | | 375/1 |
| 5,343,493 A | 8/1994 | Karimullah | | 375/1 |
| 5,343,496 A | 8/1994 | Honig et al. | | 375/1 |
| 5,347,535 A | 9/1994 | Karasawa et al. | | 375/1 |
| 5,353,302 A | 10/1994 | Bi | | 375/1 |
| 5,377,183 A | 12/1994 | Dent | | 370/18 |
| 5,386,202 A | 1/1995 | Cochran et al. | | 332/100 |
| 5,390,207 A | 2/1995 | Fenton et al. | | 375/1 |
| 5,394,110 A | 2/1995 | Mizoguchi | | 329/304 |
| 5,396,256 A | 3/1995 | Chiba et al. | | 342/372 |
| 5,423,045 A | 6/1995 | Kannan | | 395/750 |
| 5,437,055 A | 7/1995 | Wheatley, III | | 455/33.3 |
| 5,440,265 A | 8/1995 | Cochran et al. | | 329/300 |
| 5,448,600 A | 9/1995 | Lucas | | 375/205 |
| 5,481,570 A | 1/1996 | Winters | | 375/347 |
| 5,506,865 A | 4/1996 | Weaver, Jr. | | 375/205 |
| 5,513,176 A | 4/1996 | Dean et al. | | 370/18 |
| 5,533,011 A | 7/1996 | Dean et al. | | 370/18 |
| 5,553,098 A | 9/1996 | Cochran et al. | | 375/324 |
| 5,602,833 A | 2/1997 | Zehavi | | 370/209 |
| 5,606,560 A | 2/1997 | Malek | | 370/347 |
| 5,644,592 A | 7/1997 | Divsalar et al. | | 375/206 |
| 5,736,964 A | 4/1998 | Ghosh et al. | | 342/457 |
| 5,761,237 A | 6/1998 | Petersen | | |
| 5,787,130 A | 7/1998 | Kotzin et al. | | 375/346 |
| 5,844,521 A | 12/1998 | Stephens et al. | | 342/357 |
| 5,859,613 A | 1/1999 | Otto | | 342/463 |
| 5,872,540 A | 2/1999 | Casabona et al. | | 342/362 |
| 5,872,776 A | 2/1999 | Yang | | 370/342 |
| 5,894,500 A | 4/1999 | Bruckert et al. | | 375/346 |
| 5,926,761 A | 7/1999 | Reed et al. | | 455/440 |
| 5,930,229 A | 7/1999 | Yoshida et al. | | 370/203 |
| 5,953,369 A | 9/1999 | Suzuki | | 375/206 |
| 5,978,413 A | 11/1999 | Bender | | 375/206 |
| 5,995,499 A | 11/1999 | Hottinen et al. | | 370/337 |
| 6,002,727 A | 12/1999 | Uesugi | | 375/346 |
| 6,014,373 A | 1/2000 | Schilling et al. | | 370/342 |
| 6,018,317 A | 1/2000 | Dogan et al. | | 342/378 |
| 6,032,056 A | 2/2000 | Reudink | | 455/560 |
| 6,088,383 A | 7/2000 | Suzuki et al. | | 375/148 |
| 6,101,385 A | 8/2000 | Monte et al. | | 455/427 |
| 6,104,712 A | 8/2000 | Robert et al. | | 370/389 |
| 6,115,409 A | 9/2000 | Upadhyay et al. | | 375/144 |
| 6,127,973 A | 10/2000 | Choi et al. | | 342/378 |
| 6,131,013 A | 10/2000 | Bergstrom et al. | | 455/63 |
| 6,137,788 A | 10/2000 | Sawahashi et al. | | 370/342 |
| 6,141,332 A | 10/2000 | Lavean | | 370/335 |
| 6,154,443 A | 11/2000 | Huang et al. | | 370/210 |
| 6,157,685 A | 12/2000 | Tanaka et al. | | 375/346 |
| 6,157,842 A | 12/2000 | Karlsson et al. | | 455/456 |
| 6,157,847 A | 12/2000 | Buehrer et al. | | 455/561 |
| 6,163,696 A | 12/2000 | Bi et al. | | 455/436 |
| 6,166,690 A | 12/2000 | Lin et al. | | 342/383 |
| 6,172,969 B1 | 1/2001 | Kawakami et al. | | 370/342 |
| 6,175,587 B1 | 1/2001 | Madhow et al. | | 375/148 |
| 6,175,588 B1 | 1/2001 | Visotsky | | |
| 6,177,906 B1 * | 1/2001 | Petrus | | 342/378 |
| 6,185,716 B1 | 2/2001 | Riggle | | 714/769 |
| 6,192,067 B1 | 2/2001 | Toda et al. | | 375/144 |
| 6,201,799 B1 | 3/2001 | Huang et al. | | 370/342 |
| 6,215,812 B1 | 4/2001 | Young et al. | | 375/144 |
| 6,219,376 B1 | 4/2001 | Zhodzishsky et al. | | 375/148 |
| 6,222,828 B1 | 4/2001 | Ohlson et al. | | 370/320 |
| 6,230,180 B1 | 5/2001 | Mohamed | | 708/523 |
| 6,233,229 B1 | 5/2001 | Ranta et al. | | 370/330 |
| 6,233,459 B1 | 5/2001 | Sullivan et al. | | 455/456 |
| 6,240,124 B1 | 5/2001 | Wiedeman et al. | | 375/130 |
| 6,252,535 B1 | 6/2001 | Kober et al. | | 341/155 |
| 6,256,336 B1 | 7/2001 | Rademacher et al. | | 375/140 |
| 6,259,688 B1 | 7/2001 | Schilling et al. | | 370/342 |
| 6,263,208 B1 | 7/2001 | Chang et al. | | 455/456 |
| 6,266,529 B1 | 7/2001 | Chheda | | 455/436 |
| 6,275,186 B1 | 8/2001 | Kong | | 342/363 |
| 6,278,726 B1 | 8/2001 | Mesecher et al. | | 375/148 |
| 6,282,231 B1 | 8/2001 | Norman et al. | | 375/144 |
| 6,282,233 B1 | 8/2001 | Yoshida | | 375/148 |
| 6,285,316 B1 | 9/2001 | Nir et al. | | 342/357.09 |
| 6,285,319 B1 | 9/2001 | Rose | | 342/449 |
| 6,285,861 B1 | 9/2001 | Bonaccorso et al. | | 455/137 |
| 6,301,289 B1 | 10/2001 | Bejjani et al. | | 375/144 |
| 6,304,618 B1 | 10/2001 | Hafeez et al. | | 375/341 |
| 6,308,072 B1 | 10/2001 | Labedz et al. | | 455/448 |
| 6,310,704 B1 | 10/2001 | Dogan et al. | | 359/127 |
| 6,317,453 B1 | 11/2001 | Chang | | 375/140 |
| 6,321,090 B1 | 11/2001 | Soliman | | 455/440 |
| 6,324,159 B1 | 11/2001 | Mennekens et al. | | 370/203 |
| 6,327,471 B1 | 12/2001 | Song | | 455/440 |
| 6,330,460 B1 | 12/2001 | Wong et al. | | 455/562 |
| 6,333,947 B1 | 12/2001 | van Heeswyk et al. | | 375/148 |
| 6,351,235 B1 | 2/2002 | Stilp | | 342/357.06 |
| 6,351,642 B1 | 2/2002 | Corbett et al. | | 455/442 |
| 6,359,874 B1 | 3/2002 | Dent | | 370/342 |
| 6,362,760 B2 | 3/2002 | Kober et al. | | 341/141 |
| 6,363,104 B1 | 3/2002 | Bottomley | | 375/148 |
| 6,377,607 B1 | 4/2002 | Ling | | 375/130 |
| 6,377,636 B1 | 4/2002 | Paulraj et al. | | 375/346 |
| 6,380,879 B2 | 4/2002 | Kober et al. | | 341/155 |
| 6,385,264 B1 | 5/2002 | Terasawa et al. | | 375/371 |
| 6,396,804 B2 | 5/2002 | Odenwalder | | 370/209 |
| 6,404,760 B1 | 6/2002 | Holtzman et al. | | 370/342 |
| 6,414,949 B1 | 7/2002 | Boulanger | | |
| 6,430,216 B1 | 8/2002 | Kober | | 375/148 |
| 6,449,246 B1 * | 9/2002 | Barton et al. | | 370/210 |
| 6,459,693 B1 | 10/2002 | Park et al. | | 370/342 |
| 6,466,611 B1 | 10/2002 | Bachu | | |
| 6,501,788 B1 | 12/2002 | Wang et al. | | 375/148 |
| 6,515,980 B1 | 2/2003 | Bottomley | | 370/342 |
| 6,522,683 B1 | 2/2003 | Smee | | |
| 6,570,909 B1 | 5/2003 | Kansakoski et al. | | 375/148 |
| 6,570,919 B1 | 5/2003 | Lee | | |
| 6,574,270 B1 | 6/2003 | Madkour et al. | | 375/148 |
| 6,580,771 B2 | 6/2003 | Kenney | | 375/346 |
| 6,584,115 B1 | 6/2003 | Suzuki | | 370/441 |
| 6,590,888 B1 | 7/2003 | Ohshima | | 370/342 |
| 6,680,727 B2 | 1/2004 | Butler et al. | | 345/147 |
| 6,687,723 B1 | 2/2004 | Ding | | |
| 6,690,723 B1 | 2/2004 | Gosse | | |
| 6,711,219 B2 | 3/2004 | Thomas | | 375/346 |
| 6,714,585 B1 | 3/2004 | Wang et al. | | 375/148 |
| 6,724,809 B2 | 4/2004 | Reznik | | |
| 6,741,634 B1 | 5/2004 | Kim | | 375/144 |
| 6,754,340 B1 | 6/2004 | Ding | | |
| 6,798,737 B1 | 9/2004 | Dabak et al. | | 370/209 |
| 6,798,850 B1 | 9/2004 | Wedin | | 375/340 |
| 6,801,565 B1 | 10/2004 | Bottomley et al. | | 375/148 |
| 6,829,313 B1 | 12/2004 | Xu | | 375/341 |
| 6,839,390 B2 | 1/2005 | Mills | | |
| 6,882,678 B2 | 4/2005 | Kong et al. | | 375/144 |
| 6,912,250 B1 | 6/2005 | Adireddy | | 375/232 |
| 6,931,052 B2 | 8/2005 | Fuller | | |
| 6,956,893 B2 | 10/2005 | Frank | | |
| 6,963,546 B2 | 11/2005 | Misra | | |
| 6,975,669 B2 | 12/2005 | Ling | | |
| 6,975,671 B2 | 12/2005 | Sindhushayana | | |
| 7,010,073 B2 * | 3/2006 | Black et al. | | 375/355 |
| 7,027,533 B2 * | 4/2006 | Abe et al. | | 375/341 |
| 7,200,183 B2 | 4/2007 | Olson | | 375/285 |

(56) References Cited

U.S. PATENT DOCUMENTS

| | | | | |
|---|---|---|---|---|
| 7,394,879 | B2 | 7/2008 | Narayan | 375/346 |
| 7,397,842 | B2* | 7/2008 | Bottomley et al. | 375/148 |
| 7,430,253 | B2 | 9/2008 | Olson | 375/316 |
| 7,463,609 | B2 | 12/2008 | Scharf | 370/335 |
| 7,477,710 | B2 | 1/2009 | Narayan | 375/349 |
| 7,577,186 | B2 | 8/2009 | Thomas | 375/148 |
| 2001/0003443 | A1 | 6/2001 | Velazquez et al. | 342/367 |
| 2001/0020912 | A1 | 9/2001 | Naruse et al. | 342/357.06 |
| 2001/0021646 | A1 | 9/2001 | Antonucci et al. | 455/404 |
| 2001/0028677 | A1 | 10/2001 | Wang | 375/148 |
| 2001/0046266 | A1 | 11/2001 | Rakib et al. | 375/259 |
| 2002/0001299 | A1 | 1/2002 | Petch et al. | 370/350 |
| 2002/0021747 | A1 | 2/2002 | Sequeira | 375/148 |
| 2002/0051433 | A1 | 5/2002 | Affes et al. | 370/335 |
| 2002/0060999 | A1 | 5/2002 | Ma | |
| 2002/0131534 | A1 | 9/2002 | Ariyoshi | |
| 2002/0154717 | A1 | 10/2002 | Shima | |
| 2002/0172173 | A1 | 11/2002 | Schilling et al. | 370/335 |
| 2002/0176488 | A1 | 11/2002 | Kober | 375/147 |
| 2002/0186761 | A1 | 12/2002 | Corbatan | 375/231 |
| 2003/0035468 | A1 | 2/2003 | Corbatan | 375/148 |
| 2003/0050020 | A1 | 3/2003 | Erceg | 455/101 |
| 2003/0053526 | A1 | 3/2003 | Reznik | 375/148 |
| 2003/0095590 | A1 | 5/2003 | Fuller | |
| 2003/0156630 | A1 | 8/2003 | Sriram | |
| 2003/0198201 | A1 | 10/2003 | Ylitalo | 370/329 |
| 2003/0210667 | A1 | 11/2003 | Zhengdi | |
| 2003/0219085 | A1 | 11/2003 | Endres | |
| 2004/0008765 | A1 | 1/2004 | Chung | |
| 2004/0013190 | A1 | 1/2004 | Jayaraman | |
| 2004/0017867 | A1 | 1/2004 | Thomas | 375/346 |
| 2004/0136445 | A1 | 7/2004 | Olson et al. | 375/316 |
| 2004/0146093 | A1 | 7/2004 | Olson | 375/148 |
| 2004/0161065 | A1 | 8/2004 | Buckley | |
| 2004/0190601 | A1 | 9/2004 | Papadimitriou | |
| 2004/0196892 | A1 | 10/2004 | Reznik | 375/148 |
| 2004/0264552 | A1 | 12/2004 | Smee | |
| 2005/0084045 | A1 | 4/2005 | Stewart | |
| 2005/0111566 | A1* | 5/2005 | Park et al. | 375/267 |
| 2005/0129107 | A1 | 6/2005 | Park | |
| 2005/0163196 | A1 | 7/2005 | Currivan et al. | 375/144 |
| 2005/0180364 | A1 | 8/2005 | Nagarajan | 370/335 |
| 2005/0195889 | A1 | 9/2005 | Grant | 375/148 |
| 2005/0201499 | A1 | 9/2005 | Jonsson | 375/348 |
| 2005/0223049 | A1 | 10/2005 | Regis | |
| 2005/0243908 | A1 | 11/2005 | Heo | |
| 2005/0259770 | A1 | 11/2005 | Chen | |
| 2006/0013289 | A1 | 1/2006 | Hwang | |
| 2006/0227730 | A1 | 10/2006 | McCloud | 370/286 |
| 2006/0227854 | A1 | 10/2006 | McCloud | 375/148 |

FOREIGN PATENT DOCUMENTS

| | | | |
|---|---|---|---|
| DE | 4343959 | 6/1995 | H04B 7/08 |
| EP | 0558910 | 1/1993 | H04B 1/16 |
| EP | 0610989 | 1/1994 | H04B 7/04 |
| EP | 1179891 | 2/2002 | H04B 1/707 |
| GB | 2280575 | 2/1995 | H04L 27/227 |
| JP | 2000-13360 | 1/2000 | H04J 13/04 |
| WO | 93/12590 | 6/1995 | H04B 7/26 |
| WO | 01/89107 | 11/2001 | H04B 1/707 |
| WO | 02/080432 | 10/2002 | |

OTHER PUBLICATIONS

K.Hooli, et. al, "Chip-Level Channel Equalization in WCDMA Downlink," EURASIP Journal on Applied Signal Processing 2002:8, pp. 757-770.

J.Winters, "Optimal Combining in Digital Mobile Radio with Cochannel Interference," IEEE J. Selected Areas in Comm., V SAC-2 No. 4, Jul. 1984, pp. 528-539.

M.Ali-Hackl, et. al, "Error Vector Magnitude as a Figure of Merit for CDMA Receiver Design," The Fifth European Wireless Conference, Feb. 24-27, 2004.

D. Athanasios, et al, "SNR Estimation Algorithms in AWGN for HiperLAN/2 Transceiver," MWCN 2005 Morocco, Sep. 19-21, 2005.

D. Divsalar, "Improved Parallel Interference Cancellation for CDMA," IEEE Trans. Comm., V 46, No. 2, Feb. 1998, pp. 258-268.

T.Lim,S.Roy, "Adaptive filters in multiuser (MU) CDMA detection," Wireless Networks 4 (1998) pp. 307-318.

D.Guo, et. al, "A Matrix-Algebraic Approach to Linear Parallel Interference Cancellation in CDMA," IEEE Trans Comm, V. 48, No. 1, Jan. 2000, pp. 152-161.

L.Rasmussen, et. al, "A Matrix-Algebraic Approach to Successive Interference Cancellation in CDMA," IEEE Trans Comm, V. 48, No. 1, Jan. 2000, pp. 145-151.

D.Guo, et. al, "Linear Parallel Interference Cancellation in Long-Code CDMA Multiuser Detection," IEEE J. Sel. Areas Comm., V. 17, No. 12, Dec. 1999, pp. 2074-2081.

G.Xue, et. al, "Adaptive Multistage Parallel Interference Cancellation for CDMA," IEEE Journal on Selected Areas in Communications, V. 17, No. 10, Oct. 1999, pp. 1815-1827.

Y.Guo, "Advanced MIMO-CDMA Receiver for Interference Suppression: Algorithms, System-on-Chip Architectures and Design Methodology," Doctoral Thesis, Rice University, May 2005, pp. 165-180.

J.Robler, et. al, "Matched-Filter- and MMSE-Based Iterative Equalization with Soft Feedback for QPSK Transmission," International Zurich Seminar on Broadband Communications (IZS '02) pp. 19-1-19-6, Feb. 2002.

H.Dai, et. al, "Iterative Space—Time Processing for Multiuser Detection in Multipath CDMA Channels," IEEE Trans. Signal Proc., v. 50, No. 9, Sep. 2002, pp. 2116-2127.

A.Yener, et. al, "CDMA Multiuser Detection: A Nonlinear Programming Approach," IEEE Trans. Comm, V. 50, No. 6, Jun. 2002, pp. 1016-1024.

A.Persson, et. al, "Time-Frequency Localized CDMA for Downlink Multi-Carrier Systems," 2002 IEEE 7th Int. Symp. Spread Spectrum, V. 1, 2002, pp. 118-122.

Response dated May 6, 2010 to Non-Final Office Action mailed Dec. 14, 2009 re U.S. Appl. No. 11/266,928, 43 Pages.

Wang, Xiaodong et al., "Space-Time Multiuser Detection in Multipath CDMA Channels", IEEE Transactions on Signal Processing, vol. 47, No. 9, Sep. 1999, 19 Pages.

Marinkovic, Slavica et al., "Space-Time Iterative and Multistage Receiver Structures for CDMA Mobile Communications Systems", IEEE Journal on Selected Areas in Communications, vol. 19, No. 8, Aug. 2001. 11 Pages.

Jayaweera, Sudharman K. et al., "A RAKE-Based Iterative Receiver for Space-Time Block-Coded Multipath CDMA", IEEE Transactions on Signal Processing, vol. 52, No. 3, Mar. 2004. 11 Pages.

Mohamed, Nermin A. et al., "A Low-Complexity Combined Antenna Array and Interference Cancellation DS-CDMA Receiver in Multipath Fading Channels", IEEE Journal on Selected Areas in Communications, vol. 20, No. 2, Feb. 2002. 9 Pages.

Response dated May 13, 2010 to final Office Action mailed Apr. 19, 2010 re U.S. Appl. No. 11/272,411 includes Terminal Disclaimer. 6 Pages.

Notice of Allowance and Fee(s) Due with mail date of May 28, 2010 for U.S. Appl. No. 11/272,411. 7 pages.

Lin, Kun; Zhao, Kan; Chui, Edmund; Krone, Andrew; and Nohrden, Jim; "Digital Filters for High Performance Audio Delta-sigma Analog-to-Digital and Digital-to-Analog Conversions," Proceedings of ICSP '96, Crystal Semiconductor Corporation. Austin, TX, US. 5 pages.

Response dated Aug. 17, 2010 to the Final Office Action of Jun. 28, 2010, re U.S. Appl. No. 11/266,928. 47 pages.

PCT Notification of Transmittal of International Search Report and Written Opinion of International Searching Authority date of mailing Sep. 21, 2007, re Int'l Application No. PCT/US 06/36018. 10 pages.

Advisory Action Before the Filing of an Appeal Brief Office Action for reply filed Aug. 17, 2010, dated Sep. 1, 2010, in re U.S. Appl. No. 11/266,928. 2 pages.

Office Action dated May 6, 2007, with mail date of Jun. 28, 2010, re U.S. Appl. No. 11/266,928. 17 pages.

(56) References Cited

OTHER PUBLICATIONS

Notice of Allowance and Fees Due with mail date of Nov. 30, 2010 for U.S. Appl. No. 11/266,928 includes excerpt from Response to Final Office Action and Examiner's comments. 21 Pages.

Mitra, et al., "Adaptive Decorrelating Detectors for CDMA Systems," accepted for Wireless Communications Journal, accepted May 1995. 25 pages.

Schneider, "Optimum Detection of Code Division Multiplexed Signals," IEEE Transactions on Aerospace and Electronic Systems, vol. AES-15, No. 1, Jan. 1979.

Mitra, et al., "Adaptive Receiver Algorithms for Near-Far Resistant CDMA," IEEE Transactions on Communications, Apr. 1995.

Lupas, et al., "Near-Far Resistance of Multiuser Detectors in Asynchronous Channels," IEEE transactions on Communications, vol. 38, No. 4, Apr. 1990.

Lupas, et al., "Linear Multiuser Detectors for Synchronous Code-Division Multiple-Access Channels," IEEE Transactions on Information Theory, vol. 35, No. 1, Jan. 1989.

Kohno, et al., "Cancellation Techniques of Co-Channel Interference in Asynchronous Spread Spectrum Multiple Access Systems," May 1983, vol. J 56-A, No. 5.

Garg, et al., "Wireless and Personal Communications Systems," Prentice Hall, Upper Saddle River, NJ, US, 1996. pp. 79-151.

Cheng, et al., "Spread-Spectrum Code Acquisition in the Presence of Doppler Shift and Data Modulation," IEEE Transactions on Communications, vol. 38, No. 2, Feb. 1990.

Behrens, et al., "Parameter Estimation in the Presence of Low Rank Noise," pp. 341-344, Maple Press, 1988.

Best, "Phase-Locked Loops—Design, Simulation, and Applications," McGraw-Hill, 1999. pp. 251-287.

Iltis, "Multiuser Detection of Quasisynchronous CDMA Signals Using Linear Decorrelators," IEEE Transactions on Communications, vol. 44, No. 11, Nov. 1996.

Rappaport, "Wireless Communications—Principles & Practice," Prentice Hall, Upper Saddle River, NJ, US. 1996, pp. 518-533.

Scharf, et al., "Matched Subspace Detectors," IEEE Transactions on Signal Processing, vol. 42, No. 8, Aug. 1994.

Price, et al., "A Communication Technique for Multipath Channels," Proceedings of the IRE, vol. 46, The Institute of Radio Engineers, New York, NY, US, 1958. 16 pages.

Affes, et al., "Interference Subspace Rejection: A Framework for Multiuser Detection in Wideband CDMA," IEEE Journal on Selected Areas in Communications, vol. 20, No. 2, Feb. 2002.

Schlegel, et al., "Coded Asynchronous CDMA and Its Efficient Detection," IEEE Transactions on Information Theory, vol. 44, No. 7, Nov. 1998.

Xie, et al., "A Family of Suboptimum Detectors for Coherent Multiuser Communications," IEEE Journal on Selected Areas in Communications, vol. 8, No. 4, May 1990.

Viterbi, "Very Low Rate Convolutional Codes for Maximum Theoretical Performance of Spread-Spectrum Multiple-Access Channels," vol. 8, No. 4, May 1990.

Viterbi, "CDMA—Principles of Spread Spectrum Communication," Addison-Wesley, Reading, MA, US. 1995, pp. 11-75 and 179-233.

Verdu, "Mimimum Probability of Error for Asynchronous Gaussian Multiple-Access Channels," IEEE Transactions on Information Theory, vol. IT-32, No. 1, Jan. 1986.

Kalpan, "Understanding GPS—Principles and Applications," Artech House, Norwood MA, 1996, pp. 83-236.

Scharf, "Statistical Signal Processing—Detection, Estimation, and Time Series Analysis," Addison-Wesley, Reading, MA, US. 1990, pp. 23-75 and 103-178.

Stimson, "Introduction to Airborne Radar," 2nd Edition, SciTech Publishing, Mendham, NJ, US. 1998, pp. 163-176 and 473-491. 40 pages.

Behrens et al., "Signal Processing Applications of Oblique Projection Operators," IEEE Transactions on Signal Processing, vol. 42, No. 6, Jun. 1994, pp. 1413-1424.

Alexander, et al., "A Linear Receiver for Coded Multiuser CDMA," IEEE transactions on Communications, vol. 45, No. 5, May 1997.

Schlegel et al., "Multiuser Projection Receivers," IEEE Journal on Selected Areas in Communications, vol. 14, No. 8, Oct. 1996. 9 pages.

Halper, et al., "Digital-to-Analog Conversion by Pulse-Count Modulation Methods," IEEE Transactions on Instrumentation and Measurement, vol. 45, No. 4, Aug. 1996.

Ortega, et al., "Analog to Digital and Digital to Analog Conversion Based on Stochastic Logic," IEEE 0-7803-30269/95, 1995. 5 pages.

Frankel et al., "High-performance photonic analogue-digital converter," Electronic Letters, Dec. 4, 1997, vol. 33, No. 25, pp. 2096-2097. 2 pages.

Thomas, "Thesis for the Doctor of Philosophy Degree," UMI Dissertation Services, Jun. 28, 1996. Ann Arbor, MI, US.

Schlegel et al, "Projection Receiver: A New Efficient Multi-User Detector," IEEE 0-7803-2509-5/95, 1995. 5 pages.

Behrens, "Subspace Signal Processing in Structured Noise," UMI Dissertation Services, Ann Arbor, MI, US. Jun. 1990. 117 pages.

Non-Final Office Action dated Jul. 31, 2008 for U.S. Appl. No. 11/100,935 dated Apr. 7, 2005.

* cited by examiner

OPTIMAL FEEDBACK WEIGHTING FOR SOFT-DECISION CANCELLERS

CROSS-REFERENCE TO RELATED APPLICATIONS

This application is a continuation-in-part of commonly owned and co-pending U.S. patent application Ser. No. 11/100,935, filed Apr. 7, 2005, entitled "Construction of Projection Operators for Interference Cancellation."

BACKGROUND

1. Field of the Invention

The present invention relates generally to interference cancellation in received wireless communication signals, and more particularly, to forming a composite interference signal for interference cancellation.

2. Discussion of the Related Art

In an exemplary wireless multiple-access system, a communication resource is divided into subchannels and allocated to different users. For example, subchannels may include time slots, frequency slots, multiple-access codes, spatio-temporal subchannels, or any combination thereof. A plurality of sub-channel signals received by a wireless terminal (e.g., a subscriber unit or a base station) may correspond to different users and/or different subchannels allocated to a particular user.

If a single transmitter broadcasts different messages to different receivers, such as a base station in a wireless communication system broadcasting to a plurality of mobile terminals, the channel resource is subdivided in order to distinguish between messages intended for each mobile. Thus, each mobile terminal, by knowing its allocated subchannel(s), may decode messages intended for it from the superposition of received signals. Similarly, a base station typically separates signals it receives into subchannels in order to differentiate between users.

In a multipath environment, received signals are superpositions of time delayed (and complex scaled) versions of the transmitted signals. Multipath can cause co-channel and cross-channel interference that de-orthogonalizes the allocated subchannels. For example, co-channel interference may occur when time-delayed reflections of previously transmitted signals interfere with another signal from the same source. Cross-channel interference occurs when signals in a subchannel leak into and, thus, impair acquisition and tracking of other subchannels.

Co-channel and cross-channel interference can degrade communications by causing a receiver to incorrectly decode received transmissions, thus increasing a receiver's error floor. Interference may also have other deleterious effects on communications. For example, interference may diminish capacity of a communication system, decrease the region of coverage, and/or decrease maximum data rates. For these reasons, a reduction in interference can improve reception of selected signals while addressing the aforementioned limitations due to interference.

SUMMARY OF THE INVENTION

In view of the foregoing background, embodiments of the present invention may provide for optimally forming a composite interference signal for use in any subtractive or projective interference canceller. Such embodiments may be employed in any receiver employing a RAKE, such as (but not limited to) receivers configured to receive ultra-wideband (UWB), Code Division Multiple Access (CDMA), Orthogonal Frequency Division Multiplexing (OFDM), Multiple-Input/Multiple-Output (MIMO), and narrowband single-carrier signals. Embodiments of the invention may provide for analytically characterizing the signal-to-interference-and-noise ratio (SINR) in a composite signal or in a user subchannel, and choosing feedback terms (e.g., adaptive weights) to construct an interference-cancelled signal that maximizes this quantity.

In one embodiment of the invention, an SINR measurement module receives soft-symbol estimates from a baseband receiver and produces an SINR estimate for each soft-symbol estimate. A threshold comparison module compares each SINR estimate to a predetermined threshold. The threshold comparison module produces either a hard estimate or a weighted soft estimate for each soft symbol estimate based on how the corresponding SINR estimate compares to the threshold. A composite interference vector may be synthesized from hard symbol estimates or soft-weighted symbol estimates and used to cancel interference in multipath components of a received signal. A combining module (e.g., a maximal ratio combining module) combines the resulting interference-cancelled multipath components.

Receivers and cancellation systems described herein may be employed in subscriber-side devices (e.g., cellular handsets, wireless modems, and consumer premises equipment) and/or server-side devices (e.g., cellular base stations, wireless access points, wireless routers, wireless relays, and repeaters). Chipsets for subscriber-side and/or server-side devices may be configured to perform at least some of the receiver and/or cancellation functionality of the embodiments described herein.

Various functional elements, separately or in combination, depicted in the figures may take the form of a microprocessor, digital signal processor, application specific integrated circuit, field programmable gate array, or other logic circuitry programmed or otherwise configured to operate as described herein. Accordingly, embodiments may take the form of programmable features executed by a common processor or discrete hardware unit.

These and other embodiments of the invention are described with respect to the figures and the following description of the preferred embodiments.

BRIEF DESCRIPTION OF THE DRAWINGS

Embodiments according to the present invention are understood with reference to the schematic block diagrams of FIGS. 1, 2, 3A, 3B, 6, and 7, the data plots shown in FIGS. 4A and 4B, and the flow diagram of FIG. 5.

DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The general formulation for a received multipath signal $r[n]$ after filtering and sampling at a sampling rate $1/t_S$ is $$r[n] = \sum_{k=0}^{K-1} x_k[n] + w[n],$$

where $x_k[n]$ is a received signal corresponding to user (or subchannel) k for sample n, and $w(n)$ represents additive noise. The received signal $x_k[n]$ is a convolution of a transmitted signal $t_k[n]$ corresponding to user (or subchannel) k and a channel impulse response $c[n]$ corresponding to the sample rate:

$$x_k[n] = (c * t_k)[n],$$

$$c[n] = \sum_{d=0}^{D-1} c_d \delta[n-d], \text{ and } t_k[n] = \sum_{l=-\infty}^{\infty} q_k[l] a_k[n, l].$$

The term $c_d \delta[n-d]$ represents the multipath component of the channel with complex gain $c_d$ and delay d, $q_k[l]$ represents a transmitted symbol corresponding to baud l and subchannel (or user) k, and $a_k[n,l]$ is a signal waveform that may comprise a PN-covered CDMA spreading code, an OFDM subchannel, or some other signal corresponding to a decomposition of space-time. In one exemplary embodiment, $a_k[n,l]$ may represent a code value at sample n that carries the symbol $q_k[l]$. If the transmitter employs a cyclo-stationary pulse-amplitude modulator (PAM), then $a_k[n,l]$ may be represented by $a_k[n-lN]$, where N is the number of samples per symbol. When the sample rate is equal to the chip rate, the value N is the spreading gain.

An estimated transmit signal $\hat{t}[n]$ may be expressed by $$\hat{t}[n] = \sum_{k=1}^{K} \hat{t}_k[n].$$

The term $\hat{t}_k[n]$ represents an estimated transmit signal from subchannel (or user) k, $$\hat{t}_k[n] = \sum_{l=-\infty}^{\infty} f_k(\hat{q}_k[l]) a_k(n, l),$$

where $f_k(\hat{q}_k[l])$ is a hard or soft estimate of the symbol $q_k[l]$ transmitted in subchannel k on baud interval l. In practice, $f_k$ may operate on a symbol estimate $\hat{q}_k[l]$ obtained from a conventional receiver.

Figure 1:
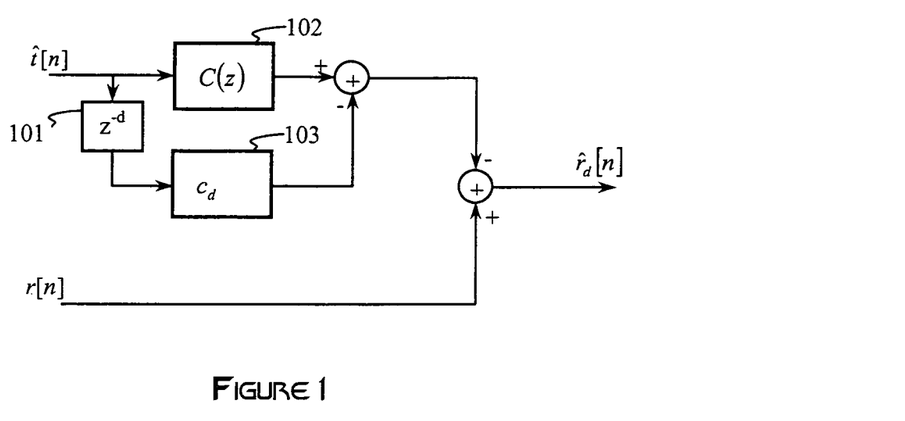
FIG. 1 is a block diagram of an interference-cancelling circuit for a particular multipath component.

The channel filter C(z) may be represented by $$C(z) = \sum_{d=0}^{D-1} c_d z^{-d},$$

where the $c_d z^{-d}$ is a filter operator corresponding to multipath component d. Thus, an output of the filter $$(C(z) - c_d z^{-d})\{\hat{t}[n]\},$$

such as shown in FIG. 1, accounts for all multipath components except path d. An interference-cancelled version of the received signal corresponding to path d is given by $$\hat{r}_d[n] = r[n] - (c[n] - c_d \delta[n-d]) * \hat{t}_d[n].$$

This interference-cancelled signal $\hat{r}_d[n]$ may be synchronized with an advance of $z^d$ and combined, e.g., via maximal ratio combining (MRC), with the other paths. A resulting MRC signal $r_{MRC}[n]$ may be expressed by $$r_{MRC}[n] = \sum_{d=0}^{D-1} \bar{c}_d \hat{r}_d[n+d]$$

$$= \sum_{d=0}^{D-1} \bar{c}_d \delta[n+d] * \hat{r}_d[n]$$

$$= \tilde{c}[n] * r[n] - \tilde{c}[n] * c[n] * \hat{t}[n] + \hat{t}[n]g$$

where the $\tilde{c}[n]$ is the matched filter version of $c[n]$ and g is its energy:

$$\tilde{c}[n] = \sum_{d=0}^{D-1} \bar{c}_d \delta[n+d] \text{ and } g = \sum_{d=0}^{D-1} |c_d|^2.$$

In FIG. 1, an interference-cancelled signal $\hat{r}_d[n]$ is constructed from the received signal $r[n]$ and the estimated transmit signal $\hat{t}[n]$ is computed for each path d. A standard receiver may estimate the user data $\{q_k[l]\}$, which may be hard decisions and/or weighted soft decisions used for constructing the estimated interference $\{\hat{t}_k[n]\}$. In a first branch, the estimated transmit signal $\hat{t}[n]$ is convolved with C(z) 102. In a second branch, the estimated transmit signal $\hat{t}[n]$ is delayed by $z^{-d}$ 102 and convolved with Cd 103. The output of the second branch is subtracted from the output of the first branch to produce a synthesized interference signal relative to path d. This synthesized interference signal is subtracted from the received signal r[n] to produce the interference-cancelled signal $\hat{r}_d[n]$ for path d.

Figure 2:
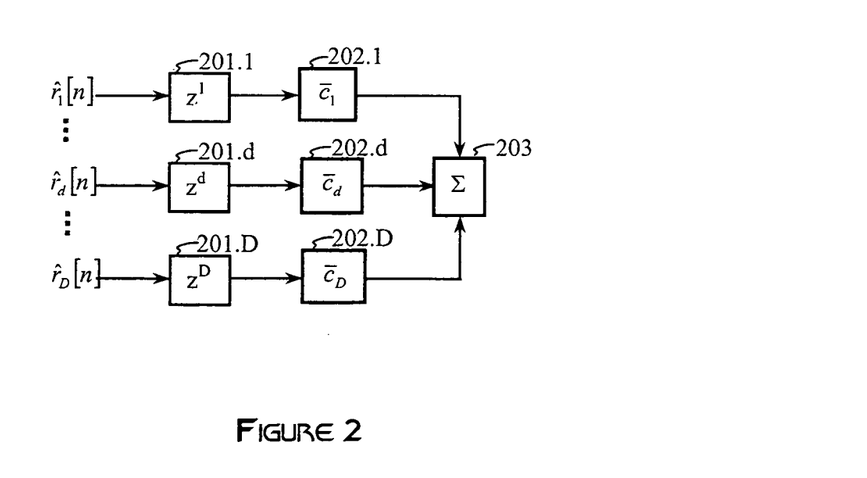
FIG. 2 is a block diagram for a circuit configured for combining interference-cancelled multipath components.
Figure 3A:
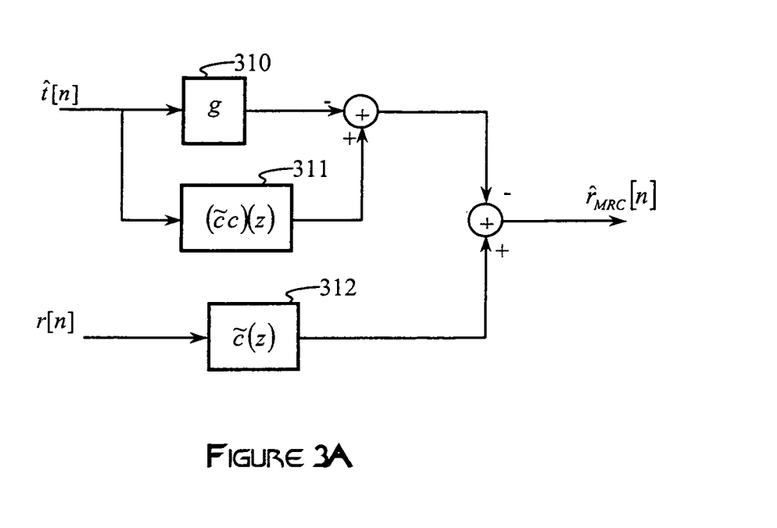
FIG. 3A is a block diagram for a circuit configured for combining interference-cancelled multipath components in accordance with an alternative embodiment of the invention.
Figure 3B:
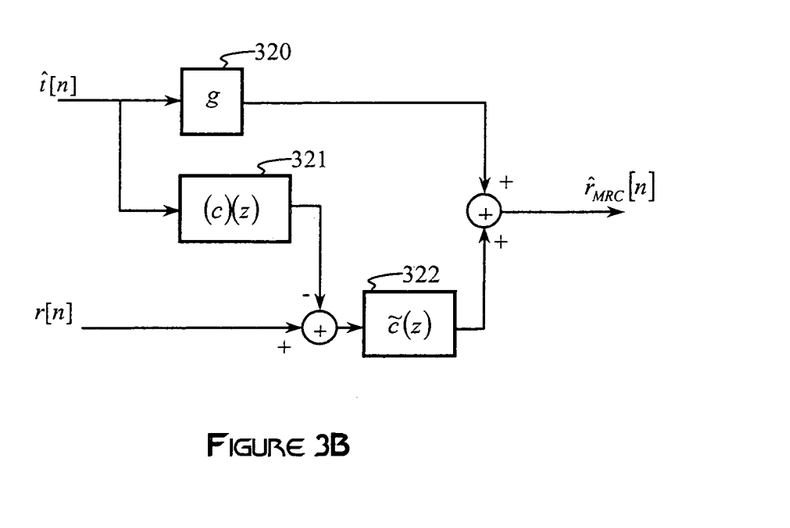
FIG. 3B is a block diagram for a circuit configured for combining interference-cancelled multipath components in accordance with yet another embodiment of the invention.

In FIG. 2, interference-cancelled signals $\hat{r}_d[n]$ for paths d=1, ..., D are combined (such as via MRC) to produce an MRC output $r_{MRC}(n)$. Specifically, each interference-cancelled signal $\hat{r}_d[n]$ is provided with a corresponding time advance $z^d$ 201.1-202.D as needed to achieve synchronization, followed by weighting $\bar{c}_d$ 202.1-202.D. Depending on the type of combining employed by the receiver, the weights $\bar{c}_d$ may or may not be matched to the values $c_d$. Alternative embodiments of the invention configured to provide for MRC combining are shown in FIGS. 3A and 3B. However, other combining techniques may be employed.

In some embodiments, a weighting factor (not shown) may be applied to the estimated transmit signal $\hat{t}_k[n]$. For example, in projective cancellation, the weighting factor may comprise a function of data and interference values. In embodiments of the invention that employ subtractive cancellation, the weighting factor may be set to 1. Although the following descriptions pertain to a subtractive cancellation embodiment, the invention is not limited to the embodiments described herein. Rather, one skilled in the art will recognize that alternative cancellation embodiments may be derived without departing from the spirit and the scope of the claimed invention.

The term $f_k(\hat{q}_k[l], SINR^o_k)$ represents a feedback function that may comprise either a weighted soft estimate or a hard estimate quantized to the symbol constellation of data symbols $\{q_k(m)\}_{m=1}^M$, and is a function of an estimated SINR of the data symbols $q_k[l]$, in subchannel k, namely $SINR^o_k$. The value $SINR^o_k$ may be obtained by various means. For example, an SINR measurement module may measure an error vector magnitude (EVM). Alternatively, the noise power may be estimated offline and compared to a measured subchannel amplitude. Other methods for determining $SINR^o_k$ may be employed using an alternative function of the estimated symbols $q_k[l]$. In an exemplary embodiment of the invention, the feedback function may be expressed by $$f(\hat{q}_k[l], SINR^o_k) = \begin{cases} \gamma_k \hat{q}_k[l], & SINR^o_k < SINR^o_{cut} \\ \text{argmin}|\hat{q}_k[l] - q(m)| & \text{else,} \end{cases}$$

where $\gamma_k$ is a scaling factor and $q(m)$ is the $m^{th}$ symbol in the symbol constellation. The threshold, or cutoff SINR ($SINR^o_{cut}$), may be determined using any of various methods that are well known in the art. An alternative embodiment may include a second cutoff SINR, below which all estimates are set to zero. Such a condition would naturally arise in quantized scaling, and also in a system having an a priori probabilistic model for the user load.

It is assumed that some standard receiver front-end (e.g., a traditional CDMA or OFDM receiver) generates estimates of the user data $q_k[l]$. When the user signals are independent, the SINR corresponding to user or subchannel k is given by $$SINR_k = \frac{P_{num}}{\sum_{k' \neq k} \rho_{k,k'} E|q_{k'} - \gamma_{k'}\hat{q}_{k'}[l]|^2 + P_{noise}}.$$

The terms $P_{num}$ and $P_{noise}$ represent signal power and noise power, respectively, at the output of an interference-cancelling receiver. Typically, the terms $P_{num}$ and $P_{noise}$ are functions of the channel power spectral density. The term $\rho_{k,k'}$ represents positive cross-correlation coefficients that are typically functions of the user signaling waveforms and the fading channel.

In the previous expression for $SINR_k$, it is assumed that the receiver does not cancel terms associated with the signal of interest (i.e., $r_k=0$). Thus, an embodiment of the invention may employ a detection/decoding strategy matched to the signal model $\hat{r}[n]=x_k[n]+\hat{w}[n]$. An alternative embodiment may allow for partial cancellation of the user of interest. Thus, the SINR may include an additional function of $\gamma_k$ in both the numerator and the denominator. Optimization over $\gamma_{k'}$ for $k' \neq k$ is unchanged, and the optimal value of $\gamma_k$ can be found from well-known techniques, such as Newton-Raphson iterations.

The term $\gamma_{k'}$ represent a set of scaling factors used to optimize $SINR_k$ by minimizing the expression $E|q_{k'}-\gamma_{k'}\hat{q}_{k'}[l]|^2$. Assuming that the symbol constellations employed are normalized to unit energy and that the estimates are soft decisions, the scaling factors $\gamma_{k'}$ are given by $$\gamma_{k'} = \frac{1}{1+1/(SINR^o_{k'})},$$

where, in this normalized solution, $1/SINR^o_{k'}$ is the average interference and noise power measured in the standard receiver for user or subchannel k, using for example EVMs. The expression $E|q_{k'}-\gamma_{k'}\hat{q}_{k'}[l]|^2$ is minimized by taking partial derivatives with respect to real and imaginary parts of $\gamma_{k'}$, followed by forcing the resulting gradient vector to zero. The resulting interference power is $$E|q_{k'}-\gamma_{k'}\hat{q}_{k'}[l]|^2 = 1/(1+SINR^o_{k'}).$$

When hard decisions $\hat{q}_{k'}[l]$ are used, the interference power is given by $$E|q_{k'} - \bar{q}_{k'}[l]|^2 = \sum_q P_q \sum_{q' \neq q} P_{q \to q'}|q - q'|^2,$$

where $P_q$ represents an a priori probability of transmitting symbol q, and $P_{q \to q'}$ is the probability of making a decision error in favor of symbol q' when q is transmitted. This error probability is a deterministic function of $SINR_k$. The trade-off between soft decisions and hard decisions is a tradeoff between the interference powers for soft and hard decisions. Thus, in one embodiment of the invention, an optimal feedback mechanism may use a hard decision whenever its resulting interference power is less than $1/(1+SINR_k)$, and a soft decision otherwise. This decision procedure may be implemented by a simple table lookup. Alternative embodiments may be employed for approximating the function $f_k(\hat{q}_k[l], SINR^o_k)$.

Figure 4A:
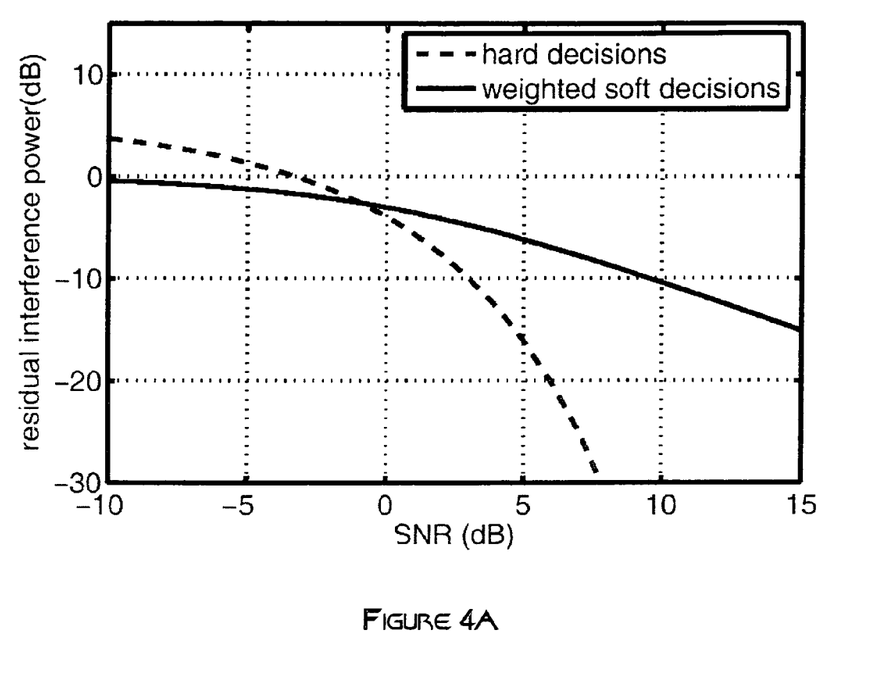
FIG. 4A is a plot from a computer model that shows residual interference energy in a QPSK system after cancellation over a range of SINR values for both hard decisions and weighted soft decisions.
Figure 4B:
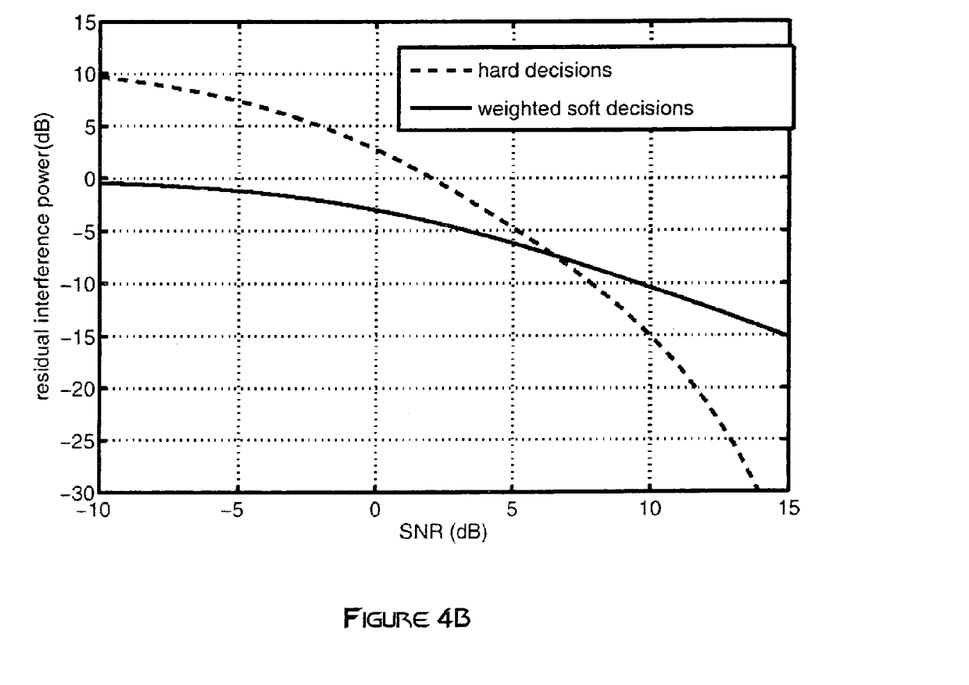
FIG. 4B is a plot from a computer model that shows residual interference energy in a 16-QAM system after cancellation over a range of SINR values for both hard decisions and weighted soft decisions.

FIG. 4A illustrates an exemplary plot from a computer model showing interference energy that remains after interference cancellation. This plot shows the interference energy over a range of SINR values for both hard decisions and weighted soft decisions. In this case, QPSK modulation was used. For this modulation, hard decisions provide better performance for SINRs that exceed about −1 dB. FIG. 4B shows a similar plot for 16 QAM modulation, except that the point where hard decisions outperform weighted soft decisions occurs at about 7 dB. The plots shown in FIGS. 4A and 4B are exemplary plots for a given set of predetermined conditions, and should not be interpreted as limiting the embodiments of the invention to a certain level of performance. Rather, different levels of performance may be obtained in different systems and under differing operating conditions.

Embodiments of the invention may be configured to select a threshold SINR (i.e., $SINR_{cut}$) based on the SINR at which hard decisions outperform weighted soft decisions. The threshold SINR may be selected based on a comparison of measurements (e.g., SINR, bit errors, or other performance measurements) for hard decisions and weighted soft decisions. Alternatively, analytical techniques may be used to determine the threshold SINR.

Embodiments of the invention may be employed in both diversity systems and MIMO channels. In the case of a single transmit antenna and multiple receive antennas (e.g., receive diversity), the channel values $c_d$ described previously are replaced with vectors, $\underline{c}_d = (c_d(1), \ldots, c_d(M))$ indexed by delay d and ordered by receive-antenna number $m = 1, 2, \ldots, M$. Signal, noise, and interference powers ($P_{num}$, $P_{noise}$, and $E|q_k - \gamma_k \hat{q}_k[l]|^2$, respectively) may be determined using quadratic forms in the various channel vectors $\underline{c}_d$, $d = 0, 1, \ldots, D-1$.

When multiple transmit antennas are employed and/or the transmit constellation points are generalized to allow for multiple time/frequency/spatial dimensions, the results generalize to matrix-valued functions of the MIMO constellation points, namely $Q(m)$, $m = 1, 2, \ldots, M$. The SINR per subchannel of a weighted soft decision subtractive receiver may be expressed as $$SINR_k = \frac{tr\{P_{num}\}}{tr\left\{\sum_{k' \neq k} \Xi_{k,k'} E(Q_{k'} - \Lambda_{k'} \hat{Q}_{k'}(l))(Q_{k'} - \Lambda_{k'} \hat{Q}_{k'}(l))^* + P_{noise}\right\}},$$

where $P_{num}$ and $P_{noise}$ are the resolved signal and noise correlation matrices at the output of the receiver (which employs MIMO transfer functions), each $\Xi_{k,k'}$ is a positive interference correlation matrix, and $\Lambda_{k'}$ is a soft decision weighting matrix.

In order to maximize the SINR per subchannel, the weighting matrices $\Lambda_{k'}$ are selected to minimize the interference power $$tr\{(Q_k - \Lambda_k Q_k(l))(Q_k - \Lambda_k Q_k(l))^*\}.$$

This is a standard linear algebraic problem. By completing the square in the expectation, the optimal weighting matrix is obtained, $$\Lambda_k = R_{QQ}(R_{QQ} + R_{k'})^{-1},$$

where $R_{QQ}$ is the transmit constellation correlation matrix (which may be identity), and $R_{k'}$ is the effective interference-plus-noise correlation matrix at the output of a soft estimation block in subchannel k'. In practice, this correlation may be estimated. The residual noise power is $$tr\{E(Q_k - \Lambda_k Q_k(l))(Q_k - \Lambda_k Q_k(l))^*\} = R_{QQ} - R_{QQ}(R_{QQ} + R_{k'})^{-1} R_{QQ}.$$

In one embodiment, a low-complexity solution is employed to operate on a diagonal model, or even a scaled identity model for the error matrix. In this case, the weighting matrix reduces to a single scalar multiplication. When the soft estimates are sufficiently reliable, hard decisions for the constellation points may be employed, such as by using a low-complexity space-time decoder. A similar expression for interference energy may be derived, except that the scalar constellations are replaced by matrix values and a trace of the resulting matrix error covariance is taken. The trade-off between soft decisions and hard decisions is a tradeoff between the interference powers for soft and hard decisions. Thus, in one embodiment of the invention, an optimal feedback mechanism may use a hard decision whenever its resulting interference power is less than the interference power of a soft decision, and a soft decision otherwise. This decision procedure may be implemented by a simple table lookup.

Figure 5:
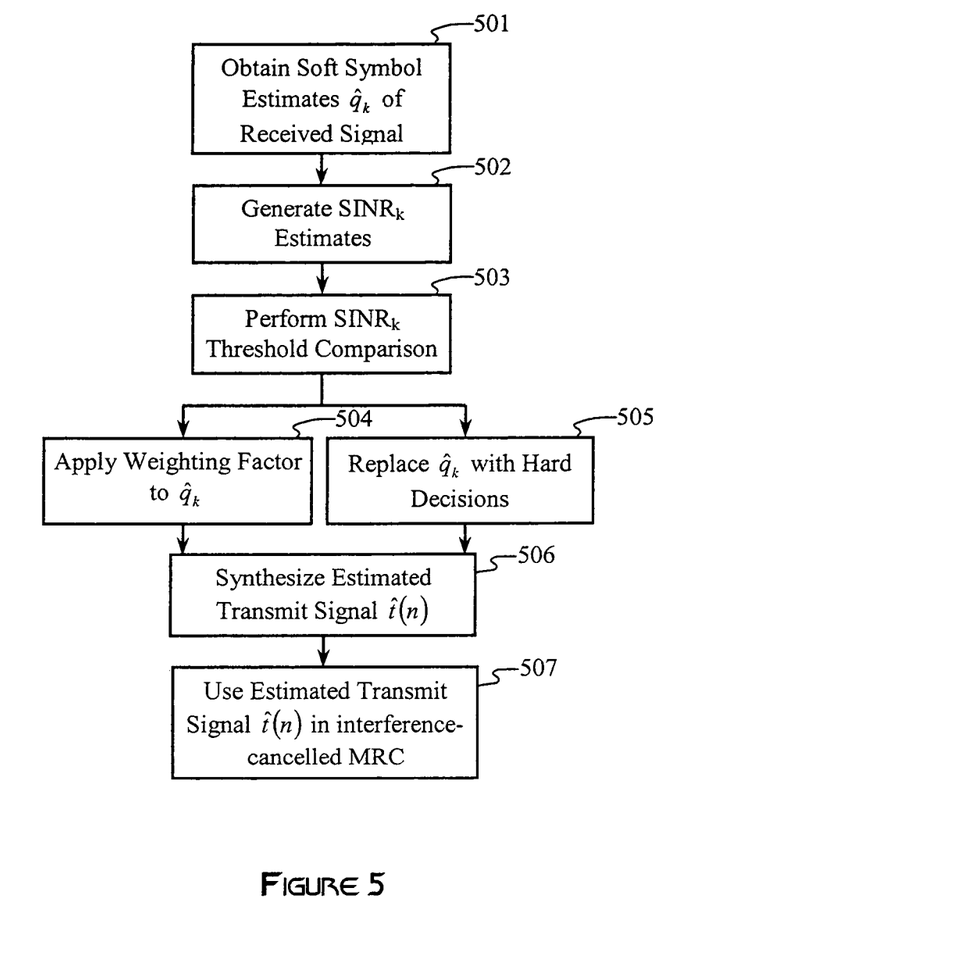
FIG. 5 illustrates a cancellation method in accordance with an embodiment of the invention.

FIG. 5 illustrates a cancellation method in accordance with an embodiment of the invention. Soft symbol estimates $\hat{q}_k[l]$ corresponding to data symbols modulated on subchannels are obtained for a received signal 501. For example, a conventional receiver may be used to produce the soft symbol estimates $\hat{q}_k[l]$ corresponding to each of a plurality of received subchannels. The received signal may be processed to generate SINR estimates for each subchannel 502. The SINR estimate is used to determine the reliability of the soft symbol estimates $\hat{q}_k[l]$. Error vector measurements (EVMs), noise floor estimates, or other alternatives may be used to estimate SINR.

The SINR measurements may be compared to at least one threshold 503 for computing processed symbol estimates from the soft symbol estimates $\hat{q}_k[l]$. For example, a weight factor of $SINR_k/(SINR_k+1)$ may be applied to soft symbol estimates $\hat{q}_k[l]$ 504 for corresponding SINR measurements that fall below a predetermined threshold. Alternatively, soft symbol estimates $\hat{q}_k[l]$ corresponding to a sufficiently high SINR may be replaced with hard decisions 505. The resulting processed symbol estimates $\hat{q}_k[l]$ may be used to synthesize at least one transmit signal $\hat{t}(n)$ 506 for use in an interference-rejecting MRC operation 507. Synthesis 506 typically involves modulating corresponding transmit waveforms (e.g., coded pulse streams, OFDM subcarriers, etc.) with the weighted symbol estimates or hard decisions, providing for channel emulation, and (optionally) resolving any synchronization issues.

Those skilled in the art should recognize that method and apparatus embodiments described herein may be implemented in a variety of ways, including implementations in hardware, software, firmware, or various combinations thereof. Examples of such hardware may include Application Specific Integrated Circuits (ASICs), Field Programmable Gate Arrays (FPGAs), general-purpose processors, Digital Signal Processors (DSPs), and/or other circuitry. Software and/or firmware implementations of the invention may be implemented via any combination of programming languages, including Java, C, C++, Matlab™, Verilog, VHDL, and/or processor specific machine and assembly languages.

Computer programs (i.e., software and/or firmware) implementing the method of this invention may be distributed to users on a distribution medium such as a SIM card, a USB memory interface, or other computer-readable memory adapted for interfacing with a consumer wireless terminal. Similarly, computer programs may be distributed to users via wired or wireless network interfaces. From there, they will often be copied to a hard disk or a similar intermediate storage medium. When the programs are to be run, they may be loaded either from their distribution medium or their intermediate storage medium into the execution memory of a wireless terminal, configuring an onboard digital computer system (e.g. a microprocessor) to act in accordance with the method of this invention. All these operations are well known to those skilled in the art of computer systems.

Figure 6:
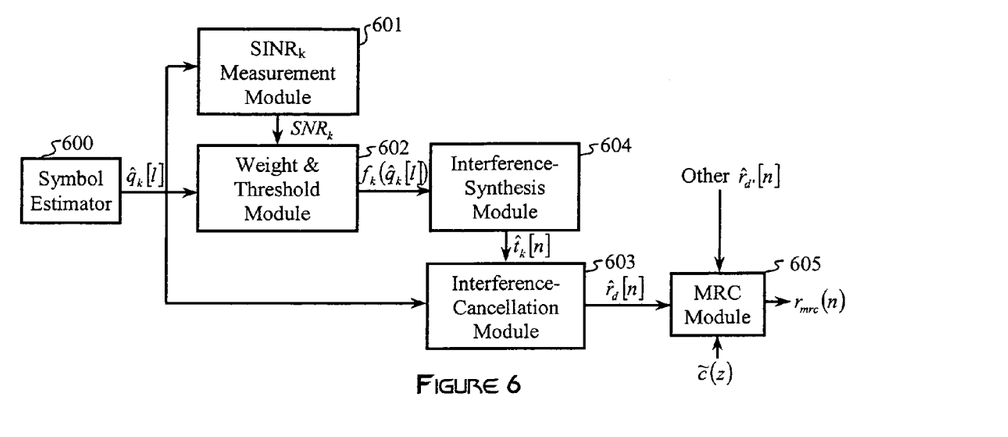
FIG. 6 is a schematic block diagram of a receiver embodiment of the invention configured to perform interference cancellation.

FIG. 6 is a schematic block diagram of a receiver embodiment of the invention configured to perform interference cancellation. A front-end symbol estimator 600 (such as a Rake, an equalizer, or other well known symbol estimator) is configured to process a received signal and generate soft symbol estimates $\hat{q}_k[l]$ of received user data modulated on a plurality of subchannels. An SINR measurement module 601 is configured to generate estimates of $SINR_k$ using EVM, noise-floor measurements, or the like, for determining the reliability of the soft symbol estimates $\hat{q}_k[l]$.

A weight & threshold module 602 may determine what SINR (or corresponding signal-quality measurement) value should be used as a threshold for selecting between hard decisions and weighted soft decisions. The weight & threshold module 602 may calculate a weight factor to be applied to soft symbol estimates $\hat{q}_k[l]$ that fail to meet the threshold and/or provide hard-decision symbol estimates q(m) to replace the soft symbol estimates $\hat{q}_k[l]$. The weight & threshold module 602 outputs processed symbol estimates, which may comprise hard decisions q(m) for highly reliable symbol estimates $\hat{q}_k[l]$ and weighted soft decisions for less reliable symbol estimates $\hat{q}_k[l]$. An interference synthesis module 604 uses the processed symbol estimates to synthesize an estimated interference signal, which is input to an interference-cancellation module 603 along with the received signal. An interference-cancelled signal relative to a particular path d is output by the interference-cancellation module 603. A combining module, such as an MRC module 605, produces a weighted sum of the interference-cancelled signal with interference-cancelled signals corresponding to other paths.

The functions of the various elements shown in the drawings, including functional blocks labeled as "modules" may be provided through the use of dedicated hardware, as well as hardware capable of executing software in association with appropriate software. When provided by a processor, the functions may be performed by a single dedicated processor, by a shared processor, or by a plurality of individual processors, some of which may be shared. Moreover, explicit use of the term "processor" or "module" should not be construed to refer exclusively to hardware capable of executing software, and may implicitly include, without limitation, digital signal processor DSP hardware, read-only memory (ROM) for storing software, random access memory (RAM), and non-volatile storage. Other hardware, conventional and/or custom, may also be included. Similarly, the function of any component or device described herein may be carried out through the operation of program logic, through dedicated logic, through the interaction of program control and dedicated logic, or even manually, the particular technique being selectable by the implementer as more specifically understood from the context.

Figure 7:
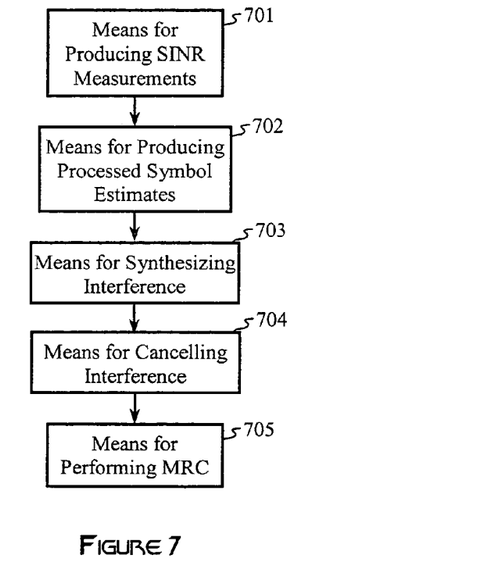
FIG. 7 is a schematic block diagram of an alternative receiver embodiment of the invention configured to perform interference cancellation.

FIG. 7 is a schematic block diagram of a receiver system configured to produce an interference-cancelled signal from a received multipath signal. The receiver system may include a conventional baseband receiver (not shown) that produces soft symbol estimates from a received multipath signal. The receiver includes a means for producing a plurality of SINR measurements 701 corresponding to the soft symbol estimates. A means for producing a plurality of processed symbol estimates 702 is coupled to the means for producing a plurality of SINR measurements 701. Each processed symbol estimate may comprise a hard estimate or a weighted soft estimate based on how each of the plurality of SINR measurements compares to a predetermined threshold. A means for synthesizing interference 703 employs the processed symbol estimates for generating a synthesized interference signal. A means for cancelling interference 704 processes the synthesized interference signal and the soft symbol estimates from the baseband receiver (not shown) to produce an interference-cancelled signal corresponding to at least one path. The means for cancelling interference 704 may be configured to perform subtraction, weighted subtraction, projection, weighted projection, or the like for producing interference-cancelled signals. The means for cancelling interference 704 may include a means for performing channel emulation (not shown). A means for performing combining (e.g., maximum ratio combining) 705 is configured for combining a plurality of interference-cancelled signals (wherein each interference-cancelled signal corresponds to a different path) for producing an interference-cancelled signal.

The means for producing a plurality of SINR measurements 701 may be, by way of example, an SINR measurement module or an EVM measurement module. Similarly, the means for producing a plurality of SINR measurements 701 may comprise various combinations of hardware and software configured for producing SINR or EVM measurements. The means for producing a plurality of processed symbol estimates 702 may comprise, by way of example, a hard estimator, a soft estimator, and a threshold detector. The means for producing a plurality of processed symbol estimates 702 may comprise any of various combinations of hardware and software configured to produce hard estimates and/or soft estimates, including weighted soft estimates. The means for synthesizing interference 703 may include, by way of example, any of various signal synthesizers. For example, a baseband signal synthesizer of the type employed in a transmitter may be used to synthesize interference. The means for cancelling interference 704 may comprise, by way of example, a subtractive canceller, a weighted subtractive canceller, a projective canceller, a weighted projective canceller, or some combination thereof. The means for performing combining 705 may be, by way of example, an MRC combiner, an Equal Gain combiner, a Minimum Mean Squared Error Combiner, a Minimum Variance Unbiased Combiner, or a Selection Combiner.

In other embodiments, the K estimated signals $t_k[n]$ may be organized into subsets. For each subset, a projection may be formed and used to project that subset of signals out of the measurement for interference cancellation. In such embodiments, each subset of the $t_k[n]$ forms a basis for an interfering subspace. This basis is constructed from hard and soft estimates of the symbols that comprise each of the $t_k[n]$. When symbols used to synthesize $t_k[n]$ are computed from a sequence of measurements, the interference cancellers are equalizing interference cancellers.

The method and system embodiments described herein merely illustrate particular embodiments of the invention. It should be appreciated that those skilled in the art will be able to devise various arrangements, which, although not explicitly described or shown herein, embody the principles of the invention and are included within its spirit and scope. Furthermore, all examples and conditional language recited herein are intended to be only for pedagogical purposes to aid the reader in understanding the principles of the invention. This disclosure and its associated references are to be construed as applying without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

We claim:

1. A receiver, comprising:
   an SINR measurement module configured for producing a plurality of SINR measurements corresponding to a plurality of soft symbol estimates from a received multipath signal,
   a weight and threshold module configured for producing a plurality of processed symbol estimates corresponding to pluralities of multipaths and subchannels, each processed symbol estimate comprising a hard estimate or a weighted soft estimate based on a predetermined SINR threshold,
   an interference-cancellation module configured for producing a plurality of interference cancelled signals, each corresponding to a different multipath,
   a combining module configured for combining the plurality of interference-cancelled signals; and
   a threshold calculation module for determining the predetermined SINR threshold.

2. The receiver recited in claim 1, wherein the threshold calculation module is configured for determining an SINR below which weighted soft decisions provide better performance than hard decisions, and above which hard decisions provide better performance than weighted soft decisions.

3. The receiver recited in claim 1, wherein the threshold calculation module is configured for determining a second cutoff SINR, below which the processed symbol estimates are set to zero.

4. The receiver recited in claim 1, further comprising a weight computation module configured for generating at least one weight for weighting at least one of the plurality of soft symbol estimates.

5. The receiver recited in claim 4, wherein the weight is expressed by $$\frac{1}{1+1/(SINR_k)},$$

where $SINR_k$ is an average signal-to-noise ratio measured for a user or subchannel k.

6. The receiver recited in claim 5, wherein $SINR_k$ is estimated via a function of the plurality of soft symbol estimates.

7. The receiver recited in claim 4, wherein the SINR measurement module is coupled to a MIMO receiver, and the weight is an optimal weighting matrix given by $\Lambda_k = R_{QQ}(R_{QQ}+R_k)^{-1}$, where $R_{QQ}$ is a transmit constellation correlation matrix and $R_k$ is an effective interference-plus-noise correlation matrix in sub channel k.

8. The receiver recited in claim 1, further comprising an interference synthesis module configured for synthesizing an estimated interference signal.

9. The receiver recited in claim 8, wherein the interference synthesis module is configured to perform channel emulation.

10. The receiver recited in claim 1, wherein the SINR measurement module is configured for estimating an error vector magnitude.

11. The receiver recited in claim 1, wherein the weight and threshold module is configured to perform quantized scaling.

12. The receiver recited in claim 1, wherein the interference-cancellation module is configured to perform at least one of subtractive cancellation, weighted subtractive cancellation, projective cancellation, and weighted projective cancellation.

13. The receiver recited in claim 1, wherein the interference-cancellation module is configured to generate a synthesized interference signal from the plurality of processed symbol estimates.

14. The receiver recited in claim 1, wherein the combining module is configured for performing maximal ratio combining.

15. The receiver recited in claim 1 being configured to process at least one of a set of signals, the set including CDMA, OFDM, MIMO, UWB, and narrowband single-carrier signals.

16. The receiver recited in claim 1, wherein the SINR measurement module is coupled to a Rake receiver.

17. The receiver recited in claim 1, wherein the receiver is included as part of at least one of a handset and a base station.

18. A receiving method, comprising:
    providing for producing a plurality of SINR measurements corresponding to a plurality of soft symbol estimates from a received multipath signal,
    providing for producing a plurality of processed symbol estimates, each processed symbol estimate comprising a hard estimate or a weighted soft estimate based on a comparison to a predetermined SINR threshold,
    providing for producing a plurality of interference-cancelled signals, each corresponding to a different multipath,
    providing for combining the plurality of interference-cancelled signals, and,
    providing for determining the predetermined SINR threshold.

19. The receiving method recited in claim 18, wherein providing for determining the predetermined SINR threshold includes determining an SINR below which weighted soft decisions provide better performance than hard decisions, and above which hard decisions provide better performance than weighted soft decisions.

20. The receiving method recited in claim 18, wherein providing for determining the predetermined SINR threshold includes determining a second cutoff SINR, below which the processed symbol estimates are set to zero.

21. The receiving method recited in claim 18, further comprising providing for generating at least one weight for weighting at least one of the plurality of soft symbol estimates.

22. The receiving method recited in claim 21, wherein the weight is expressed by $$\frac{1}{1+1/(SINR_k)},$$

where $SINR_k$ is an average signal-to-noise ratio measured for a user or subchannel k.

23. The receiving method recited in claim 22, wherein $SINR_k$ is estimated via a function of the plurality of soft symbol estimates.

24. The receiving method recited in claim 21 being configured for MIMO reception, and providing for generating at least one weight comprises generating an optimal weighting matrix expressed by $\Lambda_k = R_{QQ}(R_{QQ}+R_k)^{-1}$, where $R_{QQ}$ is a transmit constellation correlation matrix and $R_k$ is an effective interference-plus-noise correlation matrix in sub channel k.

25. The receiving method recited in claim 18, wherein providing for producing a plurality of interference-cancelled signals includes performing channel emulation.

26. The receiving method recited in claim 18, wherein providing for producing a plurality of interference-cancelled signals includes producing a synthesized interference signal from the plurality of processed symbol estimates.

27. The receiving method recited in claim 18, wherein providing for producing a plurality of SINR measurements is configured for estimating an error vector magnitude.

28. The receiving method recited in claim 18, wherein providing for producing a plurality of processed symbol estimates includes performing quantized scaling.

29. The receiving method recited in claim 18, wherein providing for producing a plurality of interference-cancelled signals includes performing at least one of subtractive cancellation, weighted subtractive cancellation, projective cancellation, and weighted projective cancellation.

30. The receiving method recited in claim 18, wherein providing for combining comprises providing for performing maximal ratio combining.

31. The receiving method recited in claim 18 being configured to process at least one of a set of signals, the set including CDMA, OFDM, MIMO, UWB, and narrowband single-carrier signals.

32. The receiving method recited in claim 18, configured to perform Rake reception.

33. A chipset configured to perform the receiving method recited in claim 18.

34. A digital computer system programmed to perform the method recited in claim 18.

35. A computer-readable medium storing a computer program implementing the method of claim 18.

36. A base station configured to perform the method of claim 18.

37. A handset configured to perform the method of claim 18.

38. A receiver, comprising:
   a means for producing a plurality of SINR measurements corresponding to a plurality of soft symbol estimates for a received multipath signal,
   a means for producing a plurality of processed symbol estimates, each processed symbol estimate comprising a hard estimate or a weighted soft estimate based on a predetermined SINR threshold,
   a means for producing a plurality of interference-cancelled signals, each corresponding to a different multipath,
   a means for combining the plurality of interference-cancelled signals, and
   a means for determining the predetermined SINR threshold.

39. The receiver recited in claim 38, wherein the means for determining the predetermined SINR threshold includes a means for determining an SINR below which weighted soft decisions provide better performance than hard decisions, and above which hard decisions provide better performance than weighted soft decisions.

40. The receiver recited in claim 38, wherein the means for determining the predetermined SINR threshold includes a means for determining a second cutoff SINR, below which the processed symbol estimates are set to zero.

41. The receiver recited in claim 38, further comprising a means for generating at least one weight for weighting at least one of the plurality of soft symbol estimates.

42. The receiver recited in claim 41, wherein the weight is expressed by $$\frac{1}{1 + 1/(SNIR_k)},$$

where $SINR_k$ is an average signal-to-noise ratio measured for a user or subchannel k.

43. The receiver recited in claim 42, wherein $SINR_k$ is estimated via a function of the plurality of soft symbol estimates.

44. The receiver recited in claim 41 further comprising a MIMO receiver, wherein the means for generating at least one weight comprises a means for generating an optimal weighting matrix expressed by $\Lambda_k = R_{QQ}(R_{QQ}+R_k)^{-1}$, where $R_{QQ}$ is a transmit constellation correlation matrix and $R_k$ is an effective interference-plus-noise correlation matrix in subchannel k.

45. The receiver recited in claim 38, wherein the means for producing a plurality of interference-cancelled signals includes a means for performing channel emulation.

46. The receiver recited in claim 38, wherein the means for producing a plurality of SINR measurements is configured for estimating an error vector magnitude.

47. The receiver recited in claim 38, wherein the means for producing a plurality of processed symbol estimates is configured for performing quantized scaling.

48. The receiver recited in claim 38, wherein the means for producing a plurality of interference-cancelled signals includes at least one of a means for performing subtractive cancellation, a means for performing weighted subtractive cancellation, a means for performing projective cancellation, and a means for performing weighted projective cancellation.

49. The receiver recited in claim 38, wherein the means for producing a plurality of interference-cancelled signals is configured for generating a synthesized interference signal from the plurality of processed symbol estimates.

50. The receiver recited in claim 38, wherein the means for combining comprises a means for performing maximal ratio combining.

51. The receiver recited in claim 38 configured to process at least one of a set of signals, the set including CDMA, OFDM, MIMO, UWB, and narrowband single-carrier signals.

52. The receiver recited in claim 38 further comprising a means for performing Rake reception.

53. A chipset, comprising:
   an SINR measurement module configured for producing a plurality of SINR measurements corresponding to a plurality of soft symbol estimates from a received multipath signal,
   a weight and threshold module configured for producing a plurality of processed symbol estimates corresponding to pluralities of multipaths and subchannels, each processed symbol estimate comprising a hard estimate or a weighted soft estimate based on a predetermined SINR threshold,
   an interference-cancellation module configured for producing a plurality of interference-cancelled signals, each corresponding to a different multipath,
   a combining module configured for combining the plurality of interference-cancelled signals, and
   a threshold calculation module for determining the predetermined SINR threshold.

54. The chipset recited in claim 53, wherein the threshold calculation module is configured for determining an SINR below which weighted soft decisions provide better performance than hard decisions, and above which hard decisions provide better performance than weighted soft decisions.

55. The chipset recited in claim 53, wherein the threshold calculation module is configured for determining a second cutoff SINR, below which the processed symbol estimates are set to zero.

56. The chipset recited in claim 53, further comprising a weight computation module configured for generating at least one weight for weighting at least one of the plurality of soft symbol estimates.

57. The chipset recited in claim 56, wherein the weight is expressed by $$\frac{1}{1+1/(SINR_k)},$$

where $SINR_k$ is an average signal-to-noise ratio measured for a user or subchannel k.

58. The chipset recited in claim 57, wherein $SINR_k$ is estimated via a function of the plurality of soft symbol estimates.

59. The chipset recited in claim 56, wherein the SINR measurement module is coupled to a MIMO receiver, and the weight is an optimal weighting matrix given by $\Lambda_k = R_{QQ}(R_{QQ}+R_k)^{-1}$, where $R_{QQ}$ is a transmit constellation correlation matrix and $R_k$ is an effective interference-plus-noise correlation matrix in subchannel k.

60. The chipset recited in claim 53, further comprising an interference synthesis module configured for producing a synthesized interference signal from at least one of the plurality of processed symbol estimates.

61. The chipset recited in claim 53, wherein the interference synthesis module is configured to perform channel emulation.

62. The chipset recited in claim 60, wherein the SINR measurement module is configured for estimating an error vector magnitude.

63. The chipset recited in claim 53, wherein the weight and threshold module is configured to perform quantized scaling.

64. The chipset recited in claim 53, wherein the interference-cancellation module is configured to perform at least one of subtractive cancellation, weighted subtractive cancellation, projective cancellation, and weighted projective cancellation.

65. The chipset recited in claim 53, wherein the interference-cancellation module is configured to generate a synthesized interference signal from the plurality of processed symbol estimates.

66. The chipset recited in claim 53, wherein the combining module is configured for performing maximal ratio combining.

67. The chipset recited in claim 53 being configured to process at least one of a set of signals, the set including CDMA, OFDM, MIMO, UWB, and narrowband single-carrier signals.

68. The chipset recited in claim 53, wherein the SINR measurement module is coupled to a Rake receiver.

69. The chipset recited in claim 53 configured to operate in at least one of a handset and a base station.

70. A handset, comprising:
an SINR measurement module configured for producing a plurality of SINR measurements corresponding to a plurality of soft symbol estimates from a received multipath signal,
a weight and threshold module configured for producing a plurality of processed symbol estimates corresponding to pluralities of multipaths and subchannels, each processed symbol estimate comprising a hard estimate or a weighted soft estimate based on a predetermined SINR threshold,
an interference-cancellation module configured for producing a plurality of interference-cancelled signals, each corresponding to a different multipath,
a combining module configured for combining the plurality of interference-cancelled signals, and
a threshold calculation module for determining the predetermined SINR threshold.

71. The handset recited in claim 70, wherein the threshold calculation module is configured for determining an SINR below which weighted soft decisions provide better performance than hard decisions, and above which hard decisions provide better performance than weighted soft decisions.

72. The handset recited in claim 70, wherein the threshold calculation module is configured for determining a second cutoff SINR, below which the processed symbol estimates are set to zero.

73. The handset recited in claim 70, further comprising a weight computation module configured for generating at least one weight for weighting at least one of the plurality of soft symbol estimates.

74. The handset recited in claim 73, wherein the weight is expressed by $$\frac{1}{1+1/(SINR_k)},$$

where $SINR_k$ is an average signal-to-noise ratio measured for a user or subchannel k.

75. The handset recited in claim 74, wherein $SINR_k$ is estimated via a function of the plurality of soft symbol estimates.

76. The handset recited in claim 73, wherein the SINR measurement module is coupled to a MIMO receiver, and the weight is an optimal weighting matrix given by $\Lambda_k = R_{QQ}(R_{QQ}+R_k)^{-1}$, where $R_{QQ}$ is a transmit constellation correlation matrix and $R_k$ is an effective interference-plus-noise correlation matrix in sub channel k.

77. The handset recited in claim 70, further comprising an interference synthesis module configured for generating a synthesized interference signal from at least one of the plurality of processed symbol estimates.

78. The handset recited in claim 77, wherein the interference synthesis module is configured to perform channel emulation.

79. The handset recited in claim 70, wherein the SINR measurement module is configured for estimating an error vector magnitude.

80. The handset recited in claim 70, wherein the weight and threshold module is configured to perform quantized scaling.

81. The handset recited in claim 70, wherein the interference-cancellation module is configured to perform at least one of subtractive cancellation, weighted subtractive cancellation, projective cancellation, and weighted projective cancellation.

82. The handset recited in claim 70, wherein the interference-cancellation module is configured to generate a synthesized interference signal from the plurality of processed symbol estimates.

83. The handset recited in claim 70, wherein the combining module is configured for performing maximal ratio combining.

84. The handset recited in claim 70 being configured to process at least one of a set of signals, the set including CDMA, OFDM, MIMO, UWB, and narrowband single-carrier signals.

85. The handset recited in claim 70, wherein the SINR measurement module is coupled to a Rake receiver.

\* \* \* \* \*